(12) United States Patent
Otremba (10) Patent No.: US 7,598,603 B2
(45) Date of Patent: Oct. 6, 2009

(54) ELECTRONIC COMPONENT HAVING A POWER SWITCH WITH AN ANODE THEREOF MOUNTED ON A DIE ATTACH REGION OF A HEAT SINK

(75) Inventor: Ralf Otremba, Kaufeuren (DE)

(73) Assignee: Infineon Technologies AG, Munich (DE)

( * ) Notice: Subject to any disclaimer, the term of this patent is extended or adjusted under 35 U.S.C. 154(b) by 283 days.

(21) Appl. No.: 11/276,809

(22) Filed: Mar. 15, 2006

(65) Prior Publication Data

US 2007/0215996 A1    Sep. 20, 2007

(51) Int. Cl.
*H01L 23/495* (2006.01)
*H01L 23/02* (2006.01)
*H01L 23/48* (2006.01)
*H01L 23/52* (2006.01)
*H01L 23/34* (2006.01)
*H01L 23/40* (2006.01)

(52) U.S. Cl. .................. 257/675; 257/666; 257/678; 257/690; 257/692; 257/712; 257/734; 257/735; 257/778; 257/784

(58) Field of Classification Search .............. 257/675, 257/696, 625, 706, E23.051, E23.101, 666, 257/678, 690, 692, 712, 734, 735, 778, 784
See application file for complete search history.

(56) References Cited

U.S. PATENT DOCUMENTS

| | | | |
|---|---|---|---|
| 5,982,029 A | 11/1999 | Graf | ............................ 257/676 |
| 6,483,181 B2 * | 11/2002 | Chang et al. | ................. 257/686 |
| 6,661,087 B2 * | 12/2003 | Wu | .............................. 257/692 |
| 7,335,534 B2 * | 2/2008 | Pavio | ........................... 438/122 |
| 2002/0130397 A1* | 9/2002 | Yew et al. | .................... 257/666 |
| 2006/0017174 A1 | 1/2006 | Otremba | ...................... 257/778 |
| 2006/0043611 A1* | 3/2006 | Kinsman | ..................... 257/784 |
| 2007/0181908 A1* | 8/2007 | Otremba | ...................... 257/107 |

FOREIGN PATENT DOCUMENTS

| | | |
|---|---|---|
| DE | 102004030042 | 1/2006 |
| GB | 1563870 | 12/1997 |

OTHER PUBLICATIONS

Andrew Sawle, "DirectFET—A Proprietary New Source Mounted Power Package for Board Mounted Power," 5 pages.
Väänänen et al., "Reducing the Crest Factor of a CDMA Downlink Signal by Adding Unused Channelization Codes," IEEE Communication Letters, vol. 6, No. 10, pp. 443-445, Oct. 2002.

* cited by examiner

*Primary Examiner*—Phat X Cao
*Assistant Examiner*—Diana C Garrity
(74) *Attorney, Agent, or Firm*—Banner & Witcoff, Ltd.

(57) ABSTRACT

An electronic component has at least one semiconductor power switch with at least one anode and at least one control electrode positioned on a first surface and at least one cathode positioned on a second surface and a heat sink with a die attach region with an upper surface. The electronic component also comprises a plurality of leads. A control lead has an upper surface which lies in a plane generally coplanar with the upper surface of the die attach region in its inner portion and above the upper surface of the inner portion in its centre portion. The anode of the semiconductor power switch is mounted on the die attach region of the heat sink and at least one control electrode is mounted on the upper surface of the inner portion of the control lead.

22 Claims, 4 Drawing Sheets

ELECTRONIC COMPONENT HAVING A POWER SWITCH WITH AN ANODE THEREOF MOUNTED ON A DIE ATTACH REGION OF A HEAT SINK

TECHNICAL FIELD

The application relates to an electronic component, in particular to an electronic component comprising at least one semiconductor power switch, and to a method for its assembly.

BACKGROUND

A semiconductor power switch may be provided by a vertical transistor device such as a vertical MOSFET or a vertical IGBT device. Semiconductor transistors include three types of electrode; for MOSFET transistors, for example, a source electrode, a gate electrode and a drain electrode, which should be electrically accessible independently of each other. The source and gate contact areas are positioned on one surface and the drain contact on the opposing surface of the device.

The semiconductor power switch is typically packaged in a housing which includes a rewiring structure which electrically connects the electrodes on both sides of the semiconductor power switch with outer contact areas of the housing. The outer contact areas may extend from on one side or two opposing sides of the package or be positioned in one face of the package, as is the case in leadless packages.

It is generally desired to decrease the size of electronic components or to increase the performance of an electronic component of a given size. One problem associated with this trend is that the heat generated by an electronic component of a given size increases. Therefore, improved heat dissipation from the component becomes important if the performance of the component is not to be adversely affected.

It is also desired to provide the customer or user of the device with an electronic component which is simple to mount and to integrate into systems provided on a higher-level printed circuit board.

SUMMARY

An electronic component, comprises at least one semiconductor power switch comprising a first surface and a second surface, wherein at least one anode and at least one control electrode are positioned on the first surface and at least one cathode is positioned on the second surface; a heat sink comprising a die attach region with an upper surface and a lower surface; a plurality of leads with an upper surface and a lower surface, each lead comprising an inner portion, a centre portion and an outer portion; wherein at least one lead is a control lead and wherein the inner portion of the control lead is spaced from the die attach region of the heat sink by a first distance and wherein the upper surface of the inner portion of the control lead lies in a plane generally coplanar with the upper surface of the die attach region of the heat sink, and wherein the upper surface of the central portion of the control lead lies in a plane above the upper surface of the inner portion of the control lead; wherein the anode of the semiconductor power switch is mounted on the die attach region of the heat sink and at least one control electrode is mounted on the upper surface of the inner portion of the control lead.

An electronic component comprises at least one semiconductor power switch comprising a first surface and a second surface, wherein at least one anode and at least one control electrode are positioned on the first surface and at least one cathode is positioned on the second surface, the semiconductor power switch having a first area; a heat sink comprising a die attach region with an upper surface and a lower surface, the die attach region having a second area which is smaller than the first area; a plurality of leads, each lead comprising an inner portion, a centre portion and an outer portion, wherein at least one lead is a control lead; a component housing having a standard power semiconductor housing outline; wherein the anode of the semiconductor power switch is mounted on the die attach region of the heat sink and wherein the control lead is attached by an electrically conductive layer to the control electrode and provides a three-dimensional rewiring structure within the component housing.

A method to assemble a semiconductor component, comprises the steps: providing at least one semiconductor power switch comprising a first surface and a second surface, wherein at least one anode and at least one control electrode are positioned on the first surface and at least one cathode is positioned on the second surface; providing a heat sink comprising a die attach region having an upper surface and a lower surface; providing a plurality of leads with an upper surface and a lower surface, each lead comprising an inner portion, a centre portion and an outer portion, wherein at least one lead is a control lead and wherein the inner portion of the control lead is spaced from the die attach region of the heat sink by a first distance and wherein the upper surface of the inner portion of the control lead lies in a plane generally coplanar with the upper surface of the die attach region of the heat sink, and wherein the upper surface of the central portion of the control lead lies in a plane above the upper surface of the inner portion of the control lead; and attaching the anode of the semiconductor power switch to the die attach region of the heat sink and attaching a control electrode to the upper surface of the inner portion of the control lead.

A method to assemble an electronic component, comprises the steps: providing a first leadframe, the first leadframe providing at least one heat sink; providing a second leadframe, the second leadframe providing at least two leads, each lead comprising an upper surface, a lower surface, an inner portion, a centre portion and an outer portion and extending in a direction generally parallel to one another, wherein the upper surface of the central portion of the control lead lies in a plane above the upper surface of the inner portion of the control lead; positioning the first leadframe and the second leadframe so that the plurality of leads of the second leadframe are positioned adjacent the die attach region of the heat sink, and so that the inner portions of the leads is spaced from the die attach region of the heat sink by a first distance and the upper surface of the inner portion of the control lead lies in a plane generally coplanar with the upper surface of the die attach region of the heat sink, providing at least one semiconductor power switch comprising a first surface and a second surface, wherein at least one anode and at least one control electrode are positioned on the first surface and at least one cathode is positioned on the second surface, and attaching the anode of the semiconductor power switch to the die attach region of the first leadframe and attaching a control electrode to the upper surface of the inner portion of one lead of the second leadframe.

DETAILED DESCRIPTION

In one embodiment, an electronic component comprises at least one semiconductor power switch, a heat sink and a plurality of leads. The semiconductor power switch comprises a first surface and a second surface. At least one anode and at least one control electrode are positioned on the first surface and at least one cathode is positioned on the second surface of the semiconductor power switch. The heat sink comprises a die attach region with an upper surface and a lower surface.

Each of the plurality of leads comprises an inner portion, a centre portion and an outer portion, each lead comprising an upper surface and a lower surface. At least one lead of the plurality of leads is a control lead. The inner portion of the control lead is spaced from the die attach region of the heat sink by a first distance and the upper surface of the inner portion of the control lead lies in a plane generally coplanar with the upper surface of the die attach region of the heat sink. The upper surface of the central portion of the control lead lies in a plane above the upper surface of the inner portion of the control lead.

The anode of the semiconductor power switch is mounted on the die attach region of the heat sink and one control electrode is mounted on the upper surface of the inner portion of the control lead.

"Upper" and "lower" are used in this context to denote the surface or side of a feature which faces upwards or faces downwards, respectively, in relation to the orientation of the component when it is mounted on a higher-level circuit board. In this context, the lower surface of the heat sink faces towards the higher-level circuit board and may be mounted directly on the higher-level circuit board. The upper surface of the heat sink and the upper surface of the leads faces away from the higher-level circuit board.

The control electrode and anode are generally coplanar as they are situated on one side of the semiconductor power switch. The semiconductor power switch is, therefore, arranged in a so-called flip-chip arrangement in which the anode faces towards the heat sink. The control electrode is positioned facing downwards and is arranged adjacent the side face of the die attach region of the heat sink.

In one embodiment, the inner portion of the control lead is positioned directly underneath the semiconductor power switch so that the control electrode is mounted on the upper surface of the control lead. The cathode electrode faces upwards away from the heat sink.

The control lead provides a rewiring structure from the control electrode which is facing downwards towards the lower side of the component. The contact electrode is mounted on the upper surface of the inner portion of the control lead and the upper surface of the centre portion of the control lead lies in a plane above the upper surface of the inner portion of the control lead. In this context "above" is used to denote a plane which lies at a greater distance from the upper and lower surface of the heat sink.

The inner portion of the control lead, therefore, provides a down set so as to provide a mounting region on the upper surface of the inner portion which lies underneath the first surface of the semiconductor power switch. The control lead, therefore, provides a three dimensional rewiring structure within the package housing. The upper surface of the central portion lies above the upper surface of the inner portion and is positioned laterally adjacent the side of the die attach region of the heat sink and, therefore is positioned at a greater distance from the side of the die attach region than the inner portion of the lead.

Due to the form of the control lead according to one embodiment, the outer portion can be provided with an arrangement which is essentially identical to the position of the outer contact leads of a known package type, such as a package type which conforms to JEDEC standards. The three-dimensional rewiring structure is provided by the inner and centre portions of the control lead within the package housing so as to provide the necessary rewiring from the downwardly facing control electrode to the desired outer contact position. The outward appearance of the component may, therefore, remain unchanged. This has the advantage that the component may be mounted on existing higher-level board without the board requiring significant modification or redesign.

The height difference between the upper surface of the inner portion and upper surface of the central portion of the control lead may be chosen so as to accommodate the thickness of the semiconductor power switch. This arrangement can reduce the overall height of the semiconductor component. The upper surface of the central portion may, therefore, be approximately coplanar with the second surface of the semiconductor power switch.

In an embodiment, the electronic component, comprises at least one semiconductor power switch, a heat sink and a plurality of leads. The semiconductor power switch comprises a first surface and a second surface. At least one anode and at least one control electrode are positioned on the first surface and at least one cathode is positioned on the second surface of the semiconductor power switch. The semiconductor power switch comprises a first area.

The heat sink comprising a die attach region with an upper surface and a lower surface. In this embodiment, the die attach region has a second area which is smaller than the first area of the semiconductor power switch. Each lead comprises an inner portion, a centre portion and an outer portion, wherein at least one lead is a control lead. The electronic component further comprises a component housing which has a standard power semiconductor housing outline.

The anode of the semiconductor power switch is mounted on the die attach region of the heat sink by an electrically conductive layer. The control lead is attached by an electrically conductive layer to the control electrode and provides a three-dimensional rewiring structure within the component housing.

The control electrode is, therefore, not in physical contact with the heat sink and is arranged adjacent the side edge of the die attach region of the heat sink. The semiconductor power switch is, therefore, arranged with respect to the heat sink and the control lead so that the region of the first surface of the semiconductor power switch in which the control electrode is positioned protrudes over a side edge of the die attach region. The control electrode may be conveniently positioned in an edge region of the first surface.

In an embodiment, the anode of the semiconductor power switch is mounted on, and electrically connected to, the die attach region of the heat sink by an electrically conductive layer positioned directly between the anode and the die attach region of the heat sink. Similarly, the control electrode is mounted on the upper surface of the inner portion of the control lead by an electrically conductive layer positioned directly between the control electrode and the upper surface of the inner portion of the control lead. This provides a simple and compact electrical connection between the first surface of the semiconductor power switch and the heat sink and control lead or leads of the component, respectively.

In an embodiment, the semiconductor power switch it is an n-channel transistor device. The anode in normal operation of the device is connected to ground. Therefore, the heat sink of the component also lies at ground potential.

In an embodiment, the lower surface of the heat sink provides the ground contact of the component. This arrangement has the advantage that the component can be mounted directly on an external electrically conductive heat sink. Electrical isolation is not required between the heat sink of the electronic component and an external electrically conductive heat sink. The heat dissipation from the electronic component may, therefore, be improved.

In electronic components in which the drain electrode is mounted on the heat sink, additional electrical isolation is typically provided on the underside of the heat sink as the drain electrode is high potential electrode. This may be provided by the customer or user of the electronic component which is undesired since the component is more complicated to mount. Alternatively, the electrical isolation is provided by the manufacturer in the form of a fully encapsulated package housing in which the plastic encapsulation material also embeds the underside of the heat sink. Both of these solutions have the disadvantage that the heat dissipation from the electronic component is reduced since the thermal path from the heat generating components to the environment is increased. These problems are avoided by providing an electronic component in which the heat sink provides the ground contact of the electronic component.

In an embodiment, the outer portion of at least control lead is bent to provide the control lead with an overall gull-wing-shape. The lower surface of the outer portion of the control lead may lie in generally the same plane at the lower surface of the heat sink and provides the outer contact surface of the lead. This arrangement simplifies the mounting of the component onto a higher-level circuit board as the contact surface provided by the lower surface of the heat sink and the contact surface provided by the outer portion of the control lead lie in approximately the same plane.

In a further embodiment, the outer portion of each of the plurality of leads is bent to provide each lead with a gull-wing-shape. The lower surface of the outer portion of the each of the plurality of leads may lie in generally the same plane at the lower surface of the heat sink and provides the outer contact surface of the lead. This arrangement simplifies the mounting of the component onto a higher-level circuit board as the contact surface provided by the lower surface of the heat sink and the contact surfaces provided by the outer portion of the leads lie in approximately the same plane.

Each of the plurality of leads of the electronic component may have essentially the same shape and, therefore, has an inner portion whose upper surface lies in approximately the same plane as the upper surface of the heat sink. The central portion of each of the leads extends upwardly and away from the side face of the die attach region of the heat sink. Therefore, the inner portion of the plurality of leads provides a recess in which the semiconductor power switch may be accommodated.

The extent to which each lead extends upwards may be chosen so as to approximately match the thickness of the semiconductor power switch. The centre portion of the lead is, in this embodiment, positioned in approximately the same plane as the upper surface of the semiconductor power switch. This has the advantage that the length of the electrical contact between the upper surface of the semiconductor power switch and the centre portion of the lead is reduced, thus reducing the inductance of the connection.

The extent to which the inner portions of the leads extends outwardly away from the side edge of the die attach portion may be chosen so that the lateral area of the semiconductor power switch can be accommodated without the side edge of the semiconductor power switch being physical contact with the inner surfaces of the leads providing the recess.

In an embodiment, the upper surface of the central portion of the plurality of leads is generally coplanar with the second side of the semiconductor power switch. This arrangement has the advantage that the thickness of the component is not increased. Furthermore, the distance between the cathode and the centre portion of the lead is decreased. Consequently, the length of an additional contact element to connect the cathode with the centre portion of the lead is reduced which advantageously reduces the inductance of the connection.

In an embodiment, the plurality of leads are positioned adjacent one side of the die attach region of the heat sink and extend in a direction generally perpendicular to the side of the die attach region of the heat sink. The leads may have the arrangement of a TO-220 or a TO-252 package.

In a further embodiment the plurality of leads are positioned adjacent two opposing sides of the die attach region of the heat sink and extend in a direction generally perpendicular to the side of the die attach region of the heat sink. The lead may have the arrangement of a power SO-package.

In an embodiment, the semiconductor power switch comprises at least one control electrode positioned in edge regions of two opposing sides of the first surface. At least one control electrode is, therefore, positioned in two opposite edge regions of the first surface of the semiconductor power switch. The anode is arranged directly between control electrodes positioned in opposing edge regions.

The upper surface of the die attach region has an area which is not a larger than the area of the anode of the semiconductor power switch. This enables the anode to be mounted on the die attach region so that the region or regions of the first surface of the semiconductor power switch in which the control electrode or control electrodes are positioned protrudes and extends over the side edge of the die attach region. This enables the control electrode to be electrically accessed by a lead positioned underneath this protruding portion of the semiconductor power switch.

At least one control lead is positioned adjacent two opposing sides of the die attach region of the heat sink. One control electrode is mounted on, and electrically connected to, each control lead. The control leads are, therefore, arranged so that the upper surface of the inner portion is positioned directly under a control electrode on each of two opposing sides of the die attach region of the heat sink. Two control electrodes and two control leads may, therefore, be arranged in a line and be arranged as essentially the same distance from their respective side faces of the die attach region of the heat sink. This arrangement has the advantage that it is mechanically stable.

In an embodiment, at least one lead extends from the heat sink. This enables the anode to be electrically accessed adjacent to the heat sink and simplifies the electrical connection of the component to external circuitry.

In an embodiment, at least one lead of the plurality of leads is a cathode lead, and the cathode electrode of the semiconductor power switch is electrically connected to the cathode lead.

The cathode of the semiconductor power switch faces upwards way from the heat sink and away from the higher-level circuit board on which the electronic component is to be mounted. The cathode may be electrically connected to the cathode lead by a contact element which may comprise at least one bond wire or at least one electrically conductive contact clip.

The cathode electrode may be electrically connected by various arrangements to at least one outer contact area which provides the cathode contact of the electronic component.

In an embodiment, the electronic component comprises at least one lead which is a cathode lead having essentially the same form as the control lead. The cathode lead has an inner portion spaced from the die attach region of the heat sink by the first distance. The upper surface of the inner portion of the cathode lead lies in a plane generally coplanar with the upper surface of the die attach region of the heat sink and the upper surface of the central portion of the cathode lead lies in a plane above the upper surface of the inner portion of the cathode lead. This arrangement has the advantage that the fabrication of the component is simplified since the leads have essentially the same form and can be fabricated using the same equipment and, if desired, at the same time.

A contact area may be positioned on the upper surface of the central portion of the cathode lead. In this case, the cathode electrode of the semiconductor power switch is electrically connected to the contact area by a contact element which extends between the cathode of the semiconductor power switch and the contact area on the centre portion of the cathode lead. The contact area may comprise a metal or two or more metal layers which provide an outer surface which is more easily bondable to the cathode contact element. The contact area may comprise a wire-bondable material or a solder wettable material for example. The contact element may be provided by at least one bond wire or a conductive clip which extends between the cathode and the contact area of the cathode lead.

In a further embodiment, the inner portion of the cathode lead is spaced at a second distance from the die attach region of the heat sink, the second distance being larger than the first distance between the inner portion of the control lead and the die attach region. The cathode electrode of the semiconductor power switch is electrically connected to the cathode lead by a contact element which may be one or more bond wires of a conductive clip.

In a further development, the inner portion of the cathode lead may lie in the same plane as the central portion of the control lead. The inner portion of the cathode lead, therefore, lies above the upper surface of the heat sink and may lie in approximately the same plane as the cathode of the semiconductor power switch. The inner portion of the cathode lead lies adjacent the edge of the semiconductor power switch. In this embodiment, the contact element extends between the cathode electrode and the inner portion of the cathode electrode. This arrangement of the cathode lead has the advantage that the lead remains on one side of the semiconductor power switch so that the distance between the contact point on the inner portion and the cathode lead may be further reduced, shortening the length of the cathode contact element. The contact element may be provided by at least one bond wire or a conductive clip.

In a further embodiment, the electronic component comprises a plurality of cathode leads which are joined by a tie bar extending in a direction generally perpendicular to the cathode leads. The cathode leads extend in direction approximately parallel to one another. The tie bar may be positioned between the portion of the contact leads on which the contact areas are positioned. The tie bar may, therefore, comprise a single contact area from which two or more leads extend to provide two or more outer cathode leads each having a outer contact areas. This arrangement has the advantage the resistance of the cathode contact can be reduced as the contact surface area between the tie bar and the contact element may be increased. This can be provided by a plurality of bond wires extending between the contact areas provided by the tie bar and the cathode or by a conductive clip which has a first contact area extending over the majority of the tie bar and a second contact area mounted on the cathode.

In a further embodiment, the electronic component further comprises a cathode contact element which comprises an inner contact portion which is positioned on the cathode electrode and at least one outer contact portion comprising at least one cathode lead. The cathode contact element is provided by a single element in this embodiment. This has the advantage that the assembly of the component is simplified as the electrical connection from the cathode is made in one mounting step. Furthermore, the resistance of the connection may be reduced as the contact element is one piece so that no intermediate joints are present which may provide a higher resistance.

The cathode contact element may comprise two outer contact portions. One outer contact portion extends on each of two opposing sides of the inner contact portion. Each outer contact portion comprises at least one cathode lead. This arrangement has the advantage that a symmetrical arrangement of the outer contact areas of the cathode lead about a centre line of the heat sink is provided. This may be advantageously used with a symmetrical arrangement of the control leads about the centre line of the heat sink.

The outer portion of each of the cathode leads may extend in a direction approximately perpendicular to the side of the die attach region of the heat sink and may have a size and dimensions which is essentially the same as the size and dimensions of the outer portion of the control electrode lead. This simplifies the mounting of the component on a higher-level circuit board.

In an embodiment, the electronic component further comprises at least one further semiconductor component. The semiconductor component may be a passive component such as a capacitor, a diode or a semiconductor power switch. The electronic component may further comprise one or more control semiconductor chips. The electronic component may comprise further electrical connections in order to electrically connect the further semiconductor component to one or more or the leads and/or to the semiconductor power switch in order to provide the desired circuit. The diode may be configured in parallel with the semiconductor power switch and may be configured as a free-wheeling diode. If two semiconductor power switches are provided, the electronic component may be provided with electrical connections so as to provide a half-bridge circuit.

In an embodiment, the further semiconductor component is mounted on the cathode of the semiconductor power switch. This stacked arrangement has the advantage that the area of the component is not increased.

The semiconductor component may also be mounted adjacent the semiconductor power switch and be mounted on the die attach region of the heat sink. This has the arrangement has the advantage that the height of the component is not increased.

The electronic component may, therefore, also be an electronic module or System-in-Package.

For each of the embodiments of the electronic module, the first vertical semiconductor power switch may be one of a MOSFET (Metal Oxide Semiconductor Field Effect Transistor) and a IGBT (Isolated Gate Bipolar Transistor) and the second vertical semiconductor power switch may be one of a MOSFET and a IGBT. In the case of a MOSFET device, the anode is conventionally denoted as the source, the cathode as the drain and the control electrode as the gate. The cathode lead is, therefore, the drain lead and the control electrode lead the gate lead. The anode lead is, therefore, the source lead. In the case of an IGBT device, the anode is conventionally denoted as the emitter, the cathode as the collector and the control electrode as the gate. The cathode lead is the emitter lead and the control electrode lead is the gate lead. The anode lead is the collector lead.

The anode electrode may be mounted on, and electrically connected to, the die attach region of the heat sink by a diffusion solder bond and the control electrode may be mounted on, and electrically connected to, the control electrode by a diffusion solder bond.

The phrase "diffusion solder bond" is used in this context to denote a connection structure which is mechanically and electrically attached to a surface by a layer comprising intermetallic phases. The intermetallic phases are located at the interface between the connection structure and the surface. The intermetallic phases are formed as a result of a diffusion soldering process and comprise chemical elements of the diffusion solder and of at least one contiguous material of, for example, the heat sink or lead.

A diffusion solder bond has the advantage that the melting point of the intermetallic phases is higher than the melting point of the diffusion solder itself. Consequently, the bond which is formed as a result of the diffusion solder process has a melt temperature which is higher than the temperature at which the bond is formed. A diffusion solder bond, therefore, has the advantage that a second semiconductor component may be mounted on the die pad in a second diffusion bonding step without the diffusion solder bond connecting the first semiconductor component to the die pad melting. Consequently, the problems associated with soft solder bonding, in particular, movement of the semiconductor components during subsequent die attach steps, are avoided. Diffusion solder bonding is, therefore, particularly advantageous for multi-chip modules in which two or more chips or semiconductor components are mounted adjacent to one another directly on the die pad or for multi-chip modules in which two components are stacked one on top of the other.

Diffusion solder bonds are typically thinner than soft solder bonds. Diffusion solder bonds are typically less than 10 µm in thickness whereas soft solder bonds typically have a thickness of around 100 µm. The smaller thickness of the diffusion solder bond has the advantage that the thermal dissipation from the semiconductor component into the die pad is improved and the thermal performance of the package is improved.

A diffusion solder bond has the further advantage that the lateral area occupied by the bond substantially corresponds to the lateral area of the semiconductor component. Consequently, a larger semiconductor power switch can be accommodated on a die attach region of a given size if a diffusion solder bond is used. Since the switching properties of the power switch are dependent on the area of the device, the performance of the component may be improved due to the provision of a larger switch on a die attach region of the same size. In contrast to soft solder joints, the structure for producing the diffusion solder bond, is fabricated by depositing the structure on the semiconductor component.

In a first embodiment, the diffusion solder bond comprises a contact layer diffusion barrier layer disposed on the contact layer, and a diffusion solder layer disposed on the diffusion barrier layer. The anode may provide the contact layer of the anode may comprise the diffusion solder bond.

The contact layer may consist essentially of aluminum and the diffusion barrier layer comprise one of the group of consisting of Ti metal and a first layer of consisting essentially of Ti metal and a second layer comprising $TiN_x$. The diffusion solder bond may comprise an alloy, the alloy comprising Sn and one of the group consisting of Ag, Au, Cu and In. The alloy comprises intermetallic phases.

The electrically conductive layer may have a thickness t where $0.1 \ \mu m \leq t \leq 100 \ \mu m$, preferably $0.1 \ \mu m \leq t \leq 10 \ \mu m$, more preferably $1.5 \ \mu m \leq t \leq 3.5 \ \mu m$.

The contact layer may have a thickness a, where $0.01 \ \mu m \leq a \leq 10 \ \mu m$, preferably $0.1 \ \mu m \leq a \leq 1 \ \mu m$. The diffusion barrier layer may have a thickness b, where $0.1 \ \mu m \leq b \leq 10 \ \mu m$, preferably $0.1 \ \mu m \leq b \leq 1 \ \mu m$. The diffusion solder layer may have a thickness c, where $0.1 \ \mu m \leq c \leq 80 \ \mu m$, preferably $0.5 \ \mu m \leq c \leq 5 \ \mu m$.

In an alternative embodiment, the diffusion solder bond comprises a contact layer and a diffusion solder layer. The contact layer comprises one of a metal and an alloy thereof, the metal being one of the group of elements consisting of Ti, Ni and Cr, and the diffusion solder layer comprises an alloy, the alloy comprising Sn and one of the group consisting of Ag, Au, Cu and In.

In a further development of the previous embodiment, at least one further layer is disposed between the contact layer and the diffusion solder layer. The further layer comprises one of a metal and an alloy thereof, the metal being one of the group of elements Ni, Au, Ag, Pt and Pd.

The electronic component may further comprise a plastic housing composition. The plastic housing composition encapsulates at least the inner portions and central portions of the leads and the semiconductor power switch. The outer portions of the leads extend outside the plastic housing composition to provide the outer contact areas of the electronic component. The lower surface of the heat sink remains unencapsulated by the plastic housing composition in one embodiment and may, therefore, provide an outer contact area or a heat sink mounting area of the electronic component. The plastic housing composition may comprise epoxy resin or a transfer molding compound as are known in the art.

In an embodiment, the heat sink comprises a heat dissipating region protruding from at least one side of the die attach region. The die attach region of the heat sink has a first thickness and the heat dissipation region has a second thickness which is smaller than the first thickness. The heat dissipating region has a lower surface which is generally coplanar with the lower surface of the die attach region of the heat sink. The lower surface of the heat sink is generally coplanar with a lower surface of the plastic housing composition.

The heat sink, therefore, comprises a base plate with a protruding portion which provides the die attach region of the heat sink. The lower surface of the base plate of the heat sink can provide an outer contact area for the electronic component if the lower surface remains exposed from the plastic encapsulation material. Advantageously, the base plate enables the exposed surface area of the heat sink to be increased while the upper surface of the die attach region remains the same. This arrangement increases the area from which heat may be dissipated from the heat sink into the ambient while still enabling the control electrodes to be accessed by the inner portions of the leads.

The height of the protruding portion or the difference in the thickness of the die attach region and heat dissipation region is chosen so as to be greater than the thickness of the inner portion of at least the control leads and any further leads which are positioned under the first surface of the semiconductor power switch. The lower surface of the inner portion of the control leads is, therefore, positioned at a distance above the upper surface of the heat dissipating region.

In a further embodiment, the height of the protruding die attach region or the thickness difference is chosen so that the lower surface of the inner portion is positioned at a selected distance from the upper surface of the heat dissipating region of the heat sink. This distance is selected so as to provide a desired blocking voltage between the lead and the heat dissipating region. The blocking voltage may be provided by the plastic housing composition if the lead and upper surface of the heat dissipating region are embedded in a plastic housing composition. The side faces of the heat dissipation region of the heat sink may also be encapsulated by the plastic housing compound. This has the advantage that voltage leaks or short circuits between the side faces of the heat dissipation region and the leads are avoided as the plastic encapsulation material provides electrical isolation.

In an embodiment, the heat dissipation region extends from one side of the die attach region and extends outside of the plastic housing composition. In this embodiment, the leads are positioned on the opposing side of the die attach region of the heat sink. The electronic component may then have a TO-type package outline such as a TO-220 or a TO-252 package.

A method according to another embodiment comprises providing at least one semiconductor power switch, a heat sink and a plurality of leads. The semiconductor power switch comprises a first surface and a second surface. At least one anode and at least one control electrode are positioned on the first surface and at least one cathode is positioned on the second surface. The heat sink comprises a die attach region with an upper surface and a lower surface. The plurality of leads have an upper surface and a lower surface. Each lead comprises an inner portion, a centre portion and an outer portion. At least one lead is a control lead.

The inner portion of the control lead is spaced from the die attach region of the heat sink by a first distance and the upper surface of the inner portion of the control lead lies in a plane generally coplanar with the upper surface of the die attach region of the heat sink. The upper surface of the central portion of the control lead lies in a plane above the upper surface of the inner portion of the control lead.

The anode of the semiconductor power switch is attached to the die attach region of the heat sink and a control electrode is attached to the upper surface of the inner portion of the control lead.

The anode of the semiconductor power switch may attached to the die attach region of the heat sink and the control electrode may be attached to the upper surface of the inner portion of the control lead by a diffusion solder process. A diffusion solder may be provided as an outer layer on the anode and control electrode of the semiconductor power switch. The heat sink and control lead may then be heated to a temperature which lies above the melting point of the diffusion solder and the anode brought into surface to surface contact with the upper surface of the heat sink and the control electrode brought into surface to surface contact with the upper surface of the control lead. Intermetallic phases with a higher melting point than the melting point of the diffusion solder are formed at the interface between the diffusion solder layer and the heat sink and control lead, respectively, and the semiconductor power switch is attached to and electrically connected to the heat sink and control lead by the solidification of the diffusion solder which occurs as a result of the formation of the intermetallic phases.

In a further method step, the cathode is electrically connected to at least one cathode lead of the plurality of leads by at least one bond wire or a contact clip.

In an embodiment, the plurality of leads are produced by selective etching a sheet, the sheet comprising a metal or an alloy thereof. Selective etching can be performed by providing an etch mask on the two opposing sides of the sheet. The uncovered regions of the sheet are then removed by etching to form the plurality of leads having the desired form.

In an embodiment, a contact area is provided on the upper surface of the central portion of the cathode lead. The cathode of the semiconductor power switch is electrically connected to the contact area by a contact element extending between the contact area and the cathode. The contact area may be provided by depositing a layer of a different material on the cathode lead. The contact area may comprise a solder wettable material or a wire-bondable material.

In a further embodiment, at least one further semiconductor component may be provided. The further semiconductor component may be mounted on the cathode of the semiconductor power switch. The semiconductor component may also be electrically connected to the cathode. This may be simply achieved by mounting the semiconductor component on the cathode by an electrically conductive adhesive, a soft solder or a diffusion solder bond. Alternatively, the further semiconductor component may be mounted on the die attach region adjacent the semiconductor power switch.

The electronic component may comprise two MOSFET devices which are configured to provide a half-bridge circuit. In this embodiment, the two MOSFET devices may be provided in a stack. The lower MOSFET device is mounted on the die attach region and electrically connected to the leads of the electronic component according to one of the embodiments previously described. The lower MOSFET device of the stack is, therefore, the low side switch of the half-bridge. The second MOSFET device is mounted on the second surface of the lower MOSFET device to provide a high side switch of the half-bridge circuit.

The method may also comprise the further step of encapsulating at least the inner portions and centre portions of the leads and the semiconductor power switch in a plastic housing composition. This may be performed using a transfer molding process.

The heat sink may further comprise a heat dissipating region protruding from at least one side of the die attach region. The heat dissipating region has a lower surface which is generally coplanar with the lower surface of the heat sink. The die attach region of the heat sink is provided with a first thickness and the heat dissipation region with a second thickness which is smaller than the first thickness.

At least one control lead may then be positioned above the upper surface of the heat dissipating region so that the lower surface of the inner portion of the control lead is spaced at a distance from the upper surface of the heat dissipating region.

The first surface of the semiconductor power switch may be attached to the heat sink so that the anode is mounted on the die attach region and the control electrode is positioned adjacent the die attach region of the heat sink and above, although not in contact with, the heat dissipating region of the heat sink. The MOSFET is arranged with respect to the heat sink and the leads so that the control electrode or control electrodes are positioned above the upper surface of the inner portion of a lead which is to be designated as a control lead. The inner portion of the lead is, therefore, positioned directly between the control electrode and the upper surface of the region of the heat sink. The lower surface of the inner portion of the control lead is, however, spaced at a distance form the upper surface of the heat dissipating region.

In a further embodiment, at least one cathode contact element is provided which comprises an inner contact portion and an outer contact portion comprising at least one cathode lead. The inner contact portion is attached to the control electrode and the outer contact portion protrudes outwardly from the cathode to provide at least one outer contact area enabling electrical access to the cathode.

In a further embodiment, the leads and heat sink are provided by a plurality of leadframes. Each leadframe may comprise a plurality of component positions which are essentially identical. Each component position provides a heat sink and leads for a single electronic component. The plurality of components positions are held together to form the leadframe strip by tie bars or support bars which are removed after the assembly of the electronic components.

A first leadframe is provided. The first leadframe provides at least one heat sink having a die attach region. A second leadframe which provides at least two leads is provided. Each lead of the second leadframe comprises an upper surface, a lower surface, an inner portion, a centre portion and an outer portion. Each lead extends in a direction generally parallel to one another. The upper surface of the central portion of the control lead lies in a plane above the upper surface of the inner portion of the control lead.

The first leadframe and the second leadframe are positioned with respect to one another so that the plurality of leads of the second leadframe are positioned adjacent the die attach region of the heat sink and so that the inner portion of the leads is spaced from the die attach region of the heat sink by a first distance and the upper surface of the inner portion of the control lead lies in a plane generally coplanar with the upper surface of the die attach region of the heat sink.

At least one semiconductor power switch is provided which comprises a first surface and a second surface. At least one anode and at least one control electrode are positioned on the first surface and at least one cathode is positioned on the second surface of the semiconductor power switch.

The anode of the semiconductor power switch is then attached to the die attach region of the first leadframe and a control electrode is attached to on the upper surface of the inner portion of one lead of the second leadframe. The anode and control electrode may be attached to the die attach region and control lead by a single diffusion solder process as previously described.

This method, which includes the use of two or more different leadframes, may be used if at least one lead extends from the heat sink. In this embodiment, therefore, the first leadframe provides the heat sink and the lead extending from it. A method including the stacking of two leadframes to provide the heat sink and leads may also be sued if the lead extending from the heat sink has a different shape to the leads which are positioned adjacent the die attach region. This enables the two types of leads to be produced independently and simplifies the production of the rewiring structure of the control leads.

The heat sink of the first leadframe may further comprise a heat dissipating region protruding from at least one side of the die attach region, the heat dissipating region having a lower surface which is generally coplanar with the lower surface of the heat sink.

If a heat dissipating region is provided, at least one control lead of the second leadframe may be positioned above the upper surface of the heat dissipating region so that the lower surface of the inner portion of the control lead is spaced at a distance from the upper surface of the heat dissipating region. This may be accomplished by the appropriate selection of the size form of the two leadframes with respect to each other and by the positioning of the two leadframes with respect to each other prior to the mounting of the semiconductor power switch.

In an embodiment, after the semiconductor power switch is mounted on the die attach region of the first leadframe and the control electrode is mounted on the control lead of the second leadframe, the cathode is electrically connected to a cathode lead by one of a bond wire or a contact clip. In this embodiment, the cathode lead may be provided by the second leadframe.

In an alternative embodiment, one or more cathode leads may be provided by a third leadframe. The third leadframe comprises at least one cathode contact element, each cathode contact element comprising an inner contact portion and an outer contact portion comprising at least one cathode lead. The inner contact portion of the cathode contact element is mounted on the control electrode to provide a mechanical and electrical connection.

After the mounting of the semiconductor power switch, and further semiconductor components if included, and the electrical connections are provided between the semiconductor power switch and/or further semiconductor component and the leads, a mold process may be carried out to provide a packaged electronic component. At least the inner portions and centre portions of the leads and the semiconductor power switch are encapsulated in a plastic housing composition. The outer surfaces of the plastic housing composition provide the outer surface of the electronic component and may conform to standard industry package outlines. The encapsulated components may be then separated from the leadframe strip.

To summarize, embodiments of an electronic component and methods to assemble the electronic component in which at least one semiconductor power switch has a so-called flip-chip arrangement are disclosed, whereby the source and gate electrodes face downwards towards the chip carrier. According to embodiments disclosed, the rewiring and contacting of the downwardly facing surface is provided by the appropriate three-dimensional structuring of the leads and heat sink within the electronic component.

The outer surfaces of the package housing and the size and positioning of the outer portions of the leads, which extend outside of the plastic housing, conform to standard package types or semiconductor power components. Therefore, the electronic component can be used as a direct replacement for components in which the semiconductor power switch has a drain down arrangement in which the source and gate electrode face upwards away from the chip carrier.

Consequently, the electrical and thermal performance of the package can be improved due to the positioning of the ground contact of the transistor on the heat sink without necessitating a change in the contacting arrangement on the circuit board to which the electronic component is attached.

The internal rewiring structure provided by the leads may be provided by a single lead frame or may be provided by two or more lead frames which are arranged together to provide the desired rewiring structure. Each lead frame may be produced by conventional selective etching processes or pressing or stamping. The electronic component is, therefore, also simple to produce by modifications to conventional processes.

Figure 1:
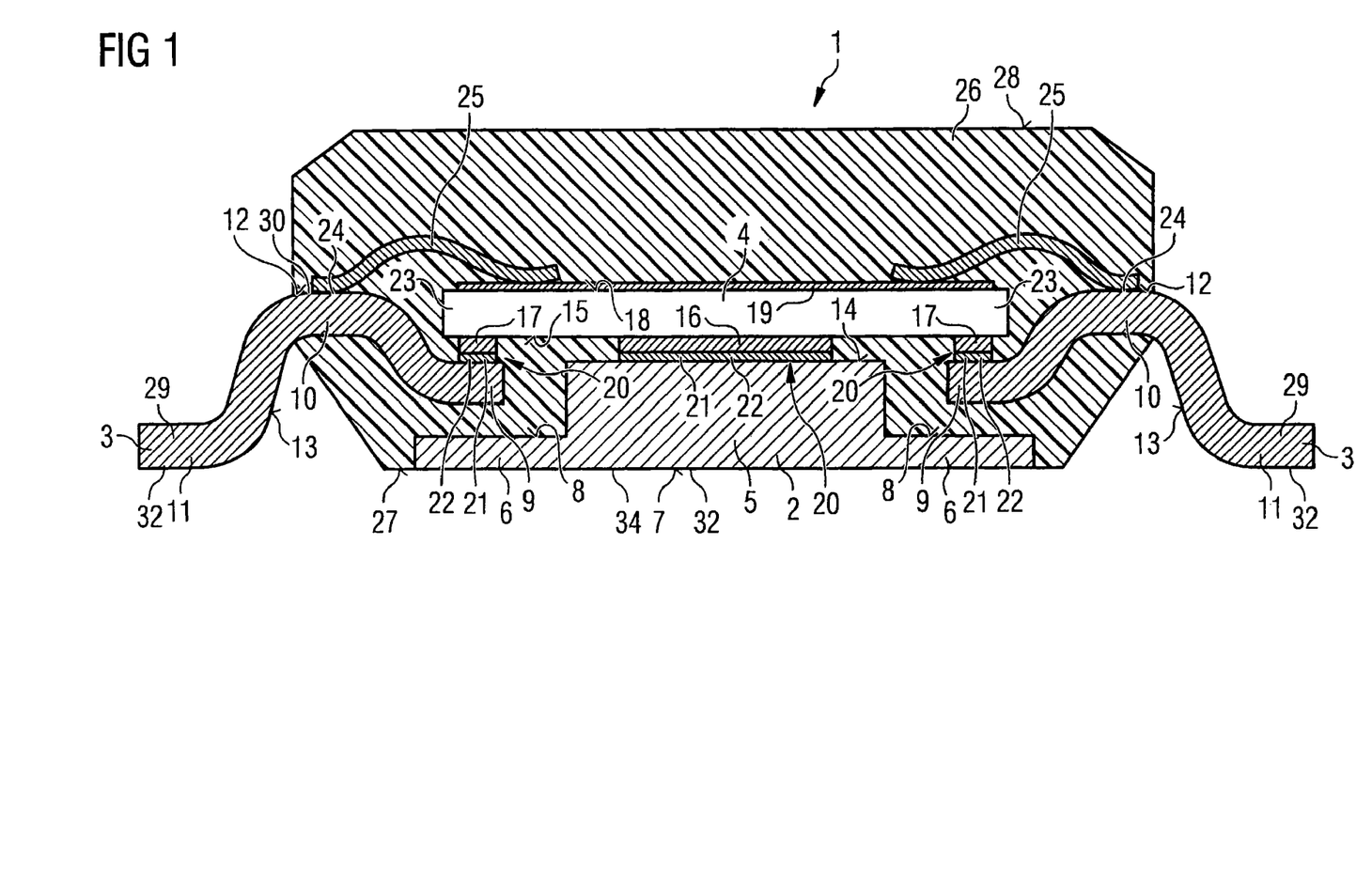
FIG. 1 illustrates a cross-sectional view of an electronic component according to a first embodiment.

FIG. 1 illustrates an electronic component 1 according to a first embodiment. The electronic component 1 comprises a heat sink 2, a plurality of leads 3 and a MOSFET device 4. The heat sink 2 and leads 3 consist essentially of copper.

The heat sink 2 comprises a die attach region 5 and a heat dissipating region 6. The heat sink 2 is overall generally rectangular and the die attach region 5 and heat dissipating region 6 also have a generally rectangular shape. The heat dissipating region 6 is laterally larger than the die attach region 5.

The die attach region 5 has a thickness and the heat dissipating region 6 has a thickness which is smaller than the thickness of the die attach region 5. The lower surface 7 of the die attach region 5 and the lower surface 7 of the heat dissipating region 6 of the heat sink 2 are essentially coplanar. The die attach region 5, therefore has the form of a protrusion from the upper surface 8 of the heat dissipating region 6. The die attach region 5 protrudes a height above the upper surface 8 of the heat dissipating region 6 of the heat sink 2.

In the first embodiment, the die attach region 5 is positioned approximately centrally between the two long sides of the heat dissipating region 6 so that a heat dissipating region 6 protrudes outwardly from the base region of the two opposing long sides of the die attach region 5. The electronic component 1 also includes a plurality of leads 3 arranged in two groups, each having an equal number. One group of leads 3 is positioned adjacent each of the two long sides of the die attach region 5 of the heat sink 2. The leads 3 are not in physical contact with the heat sink 2. Each of the leads 3 is essentially identical and will be described in the singular for clarity.

Each lead 3 comprises an inner portion 9, the centre portion 10 and an outer portion 11 as well as and upper surface 12 and lower surface 13. The lead 3 can be described as having an overall gull-wing shape. The upper surface 12 of the inner portion 9 is positioned so that is it essentially coplanar with the upper surface 14 of the die attach region 5 of the heat sink 2. The centre portion 10 extends upwardly from the inner portion 9 and away from the die attach region 5 so as to provide an upper surface region 12 which lies in a plane above the upper surface 12 of the inner portion 9.

The centre portion 10 of the lead 3, therefore, comprises an upper surface region which lies in plane above the upper surface 14 of the die attach region 5 of the heat sink 2. The centre portion 10 of the lead 3 lies in a plane essentially parallel to the upper surface 14 of the die attach region 5 and upper surface 12 of the inner portion 9 of the lead 3. The outer portion 11 of the lead 3 is bent downwards so that the lower surface 13 of the outer portion 10 of the lead 3 is essentially coplanar with the lower surface 7 of the heat sink 2. The lower surface 13 of the outer portion 11 of the lead 3 provides an outer contact area 32 of the electronic component 1. In this embodiment, the lead 3 has essentially the same thickness in the three portions 9,10 and 11. Each of the plurality of leads 3 can, therefore, be described as a bent strip which has a general gull-wing shape.

The arrangement and dimensions of the outer portion 11 of the leads 3 conforms to a standard package outline. Each of the leads 3, therefore, provides a three-dimensional rewiring structure which is enclosed within the standard package outline by which contact areas on the downwardly facing surface 15 of the MOSFET device 4 can be accessed.

The MOSFET device 4 is a n-channel vertical power MOSFET device with over-temperature protection and overload protections circuits. The MOSFET device 4 is generally rectangular and comprises a first surface 15 on which the source electrode 16 and two gate electrodes 17 are positioned. One gate electrode 17 is positioned in the edge region 23 of two opposing long sides of the MOSFET device and the source electrode 17 is positioned between them in the centre region of the first surface 15. The second surface 18 of the MOSFET device 4 opposes the first surface 15 and comprises the drain electrode 19 which extends over the majority of the second surface 18. The source electrode 16, gate electrode 17 and drain electrode 29 consist essentially of aluminum with a small proportion of silicon. The MOSFET device 4 is positioned with its first surface 15 facing towards the upper surface 14 of the die attach region 5.

The source electrode 16 is mounted on, and electrically connected to, the upper surface 14 of the die attach region 5 by a diffusion solder bond 20. In this embodiment, the source electrode 16 consists essentially of aluminum and the diffusion solder bond 20 comprises a diffusion barrier layer consisting of titanium, which is not shown in FIG. 1, and a diffusion solder layer 21 which is arranged directly between the titanium layer and the upper surface 14 of the die attach region 5. Since the MOSFET device 4 is mounted on the die attach region 5, the diffusion solder layer 21 comprises intermetallic phases 22 which are the product of a reaction between the diffusion solder and the copper of the die attach region 5.

The MOSFET device 4 is laterally larger than the die attach region 5 and is arranged on the die attach region 5 so that the edge regions 23 of the first surface 15, in which the gate electrodes 17 are positioned, are positioned above, and spaced at a distance from, the heat dissipating region 6 of the heat sink 2. A lead 3 is positioned under each gate electrode 17 so that the gate electrodes 17 are each mounted on the upper surface 12 of the inner portion 9 of the lead 3 by a diffusion solder bond 20 which is essentially the same as the diffusion solder bond 20 by which the source electrode 16 is mounted to the upper surface 14 of the die attach region 5.

The inner portion 9 of the lead 3 is positioned adjacent the die attach region 5 and has a thickness which is less than the height c by which the die attach region 5 protrudes from the upper surface 8 of the heat dissipating region 6. Therefore, the lower surface 13 of the inner portion 9 of the lead 3 is spaced at a distance from the upper surface 8 of the heat dissipating region 6. The upper surface 12 of the centre portion 10 of the lead 3 is positioned in approximately the same plane as the drain electrode 19 and is positioned adjacent the side of the MOSFET device 4. The lead 3, which is attached to the gate electrode 17, is, therefore, the gate lead 29 of the electronic component 1. The electronic component 1 also comprises a second gate lead 29 which is positioned on the opposing side of the die attach region 5 and is attached to the second gate electrode 17 as previously described for the first gate electrode 17. The second gate electrode 17 is positioned in the opposing edge region 23 of the first surface 15 to the first gate electrode 17.

The shape and arrangement of each of the two groups of leads 3 positioned on each of the two opposing sides of the heat sink 3 is essentially the same. Therefore, when the leads 3 are considered together, the inner portions 9 provide a recess which is able to accommodate the volume of the MOSFET device 4. Each of the leads 3, therefore, has a "down-set" provided by the inner portion 9. The lowered inner portion 9 of two oppositely arranged leads 3 are provided with a form and a spacing between the two opposing groups so that a distance between the centre portion 10 of two opposing leads 3 which is larger than the width of the MOSFET device 4. The form of the inner portion 9 or "down-set" is greater than the thickness of the MOSFET device 4.

The MOSFET device 4 can, therefore, be accommodated within the recess so that the MOSFET device 4 is only in contact with the leads 3 via the diffusion solder bond 20 between the gate electrode 17 and the leads 3. The MOSFET device 4 is arranged within the recess so that it is not in physical contact with the sides of the recess, i.e. the upwardly extending portion of the leads 3 or with the centre portion 10 of the leads 3.

The drain electrode 19 is electrically connected to two leads 3 which provide two drain leads 30 of the electronic component 1. The drain electrode 19 is electrically connected to the drain leads 30 by bond wires 25 which extend between the drain electrode 19 and a contact area 24 positioned on the upper surface 12 of the centre portion 10 of the drain lead 30. In this embodiment, the drain electrode 19 is connected by two bond wires 25, each extending between a drain electrode 19 and one of two drain leads 30 which are positioned on opposite sides of the heat sink 2.

The electronic component 1 further comprises plastic encapsulation material 26 which encapsulates the MOSFET device 4, bond wires 25, inner portions 9 and centre portions 10 of the leads 3 and the upper surfaces 8, 14 of the heat sink 2. The lower surface 7 of the heat sink 2 remains uncovered from the plastic encapsulation material 26 and lies in essentially the same plane as the lower surface 27 of the plastic encapsulation 26. The lower surface 7 of the heat sink 2, therefore, provides an outer contact area 32 of the electronic component 1.

The MOSFET device 4 is an n-channel MOSFET device so that the source electrode 16, in normal operation of the device, is connected to ground potential. Since the source electrode 16 is electrically connected to the heat sink 2 by the diffusion solder bond 20, the lower surface 7 of the heat sink 2 provides the ground contact 32 of the electronic component 1.

The plastic encapsulation material 26 is an epoxy resin which provides an electrical isolation between the rewiring structure provided by the leads 3 within the body of the electronic component 1. In particular, the space between the inner portion 9 of the leads 3, the die attach region 5 and heat dissipating region 6 of the heat sink 2 is filled by the plastic encapsulation material 26 which provides a sufficient electrical isolation.

In this first embodiment, the size and form of the outer surfaces 28 of the plastic encapsulation material 26 and of the outer portions 11 of the leads 3 conforms to a standard power S0-8 package. The shape of the leads 3 within the plastic encapsulation material 26 and the arrangement of the heat sink 2, inner portion 9 and centre portion 10 of the leads 3 in combination with the orientation and electrical connection of the MOSFET device 4 advantageously enables the source down arrangement of the MOSFET device 4 to be accommodated within a standard package outline.

Figure 2:
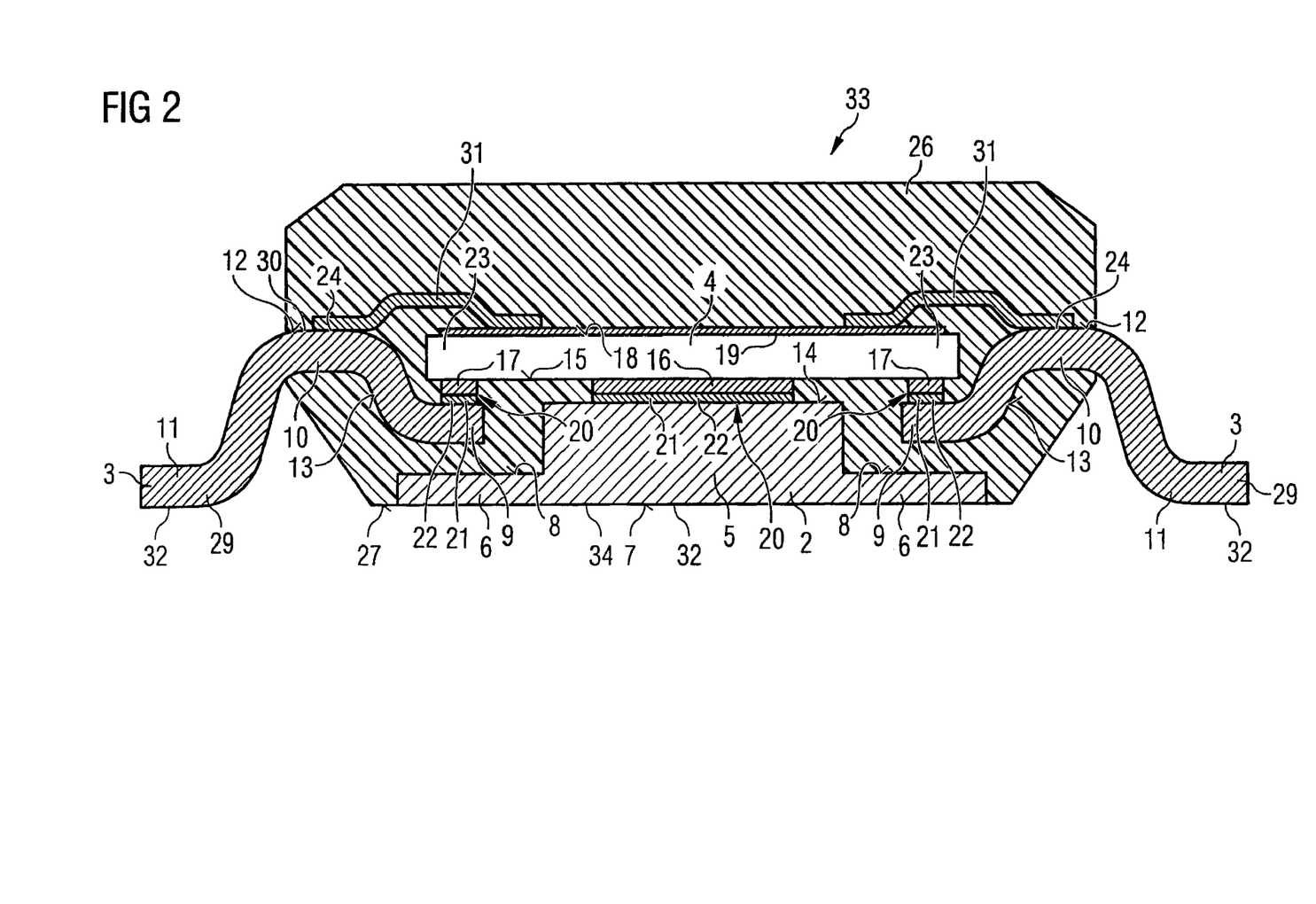
FIG. 2 illustrates a cross-sectional view of an electronic component according to a second embodiment.

FIG. 2 shows an electronic component 33 according to a second embodiment. Features of the second electronic component 33 which are essentially the same as those of the electronic component 1 shown in FIG. 1 are denoted with the same reference numbers and are not necessarily described in detail again.

In the second electronic component 33, the heat sink 2, plurality of leads 3 and MOSFET device 4 have essentially the same arrangement as shown in the first embodiment in FIG. 1. In the electronic component 33, the drain electrode 19 is electrically connected to the drain leads 29 by electrically conductive contact clips 31. The electronic component 33 includes two drain leads and two conductive clips 31, a conductive clip 31 extending between the drain electrode 19 and the upper surface 12 of the centre portion 10 of the drain lead 29. Each conductive clip 31 is mounted on the drain electrode 19 and the upper surface 12 of the centre portion 10 of the drain lead 29 by soft solder. Therefore, a contact area 24 is provided on the upper surface 12 of the centre portion 10 or the drain lead 29 which comprises a material which is wetted by soft solder.

In a further embodiment not shown in the figures, a cathode contact element is provided which consists of a single piece which has an outer portion having a form corresponding to the outer portion 11 of the drain leads 29 and an inner portion is mounted on the drain electrode 19 by solder. The cathode contact element can be thought of as a conductive clip 31 with an integral drain lead 29 which may extend from one or more sides of the conductive clip 31.

The electronic components 1 and 33 according to the first and second embodiment may be assembled using two lead frame strips. The first lead frame strip comprises a plurality of component positions, each component position is essentially the same and only one component position of the strip is depicted in the figures. Each component position of the first leadframe strip provides a heat sink having the form shown in figures one and two. A second lead frame strip is provided which also comprises a plurality of component positions, each of which is essentially the same. The second leadframe strip provides the plurality of leads 3. The leads 3 of each component position are arranged in two opposing groups and have a spacing between the groups which is large enough to accommodate the die attach region 5 of the heat sink 2 of the first lead frame strip.

The second lead frame strip is then arranged in combination with the first lead frame strip so that the leads 3 have the arrangement shown in the cross-sectional view of FIGS. 1 and 2 with respect to the heat sink 5. In particular, the upper surface 12 of the inner portion 9 of the leads 3 is positioned to be essentially coplanar with the upper surface 14 of the die attach region 5. Each of the two groups of leads 3 is arranged so that the inner portion 9 is positioned adjacent its respective side of die attach region 5 and above, and not in physical contact with, the upper surface 8 of the heat dissipating region 6 of the heat sink 2.

A vertical power MOSFET device 4 is provided which has a first surface 15 with a source electrode 16 and gate electrodes 17. At least one gate electrode is arranged in the edge region 23 of two opposing long sides of the first surface 15 of the MOSFET device 4. A drain electrode 19 is positioned on the opposing surface 18 of the MOSFET device 4. A diffusion solder layer is deposited on the outer surface of the source electrode 16 and the gate electrodes 17.

The MOSFET device is mounted on the heat sink 2 by a diffusion solder process by heating the two leadframes to a temperature above the melting point of the diffusion solder. The MOSFET device 4 is brought into contact with the heat sink 2 and leads 3 so that the source electrode 16 is in surface to surface contact with the upper surface 14 of the die attach region 5 and a gate electrode 17 is in surface to surface contact with a gate lead 29 positioned on the two opposing sides of the die attach region 5. Intermetallic phases 22 are formed in the diffusion solder layer by a reaction between the diffusion solder and the material of the upper surface of the die attach region 5 and gate leads 29. Since the intermetallic phases have a higher melting point than the melting point of the diffusion solder, the MOSFET device 4 is attached to the heat sink 2 and gate leads 29 by the solidification of the diffusion solder.

Bond wires 25 are then formed between the drain electrode 19 and at least one lead 3 which provides a drain lead 30 by conventional wire-boding techniques. Alternatively, a conductive clip 31 may be used to electrically connect the drain electrode 30 with at least one drain lead. The conductive clip 31 is attached to the drain electrode 19 and the drain lead 30 by solder.

A molding process is then carried out to encapsulate the bond wires 25, MOSFET device 4, inner portion 9 and centre portion 10 of the leads 3 and at least the upper surfaces 8, 14 of the heat sink 2. The outer portions 11 of the leads 3 protrude from the side faces of the plastic encapsulation 26 and provide the outer contact areas 34 of the electronic component. The lower surface 7 of the heat sink 2 also remains uncovered by the plastic encapsulation material 26 and provides a ground contact area 34 of the electronic component 1, 33.

Figure 3:
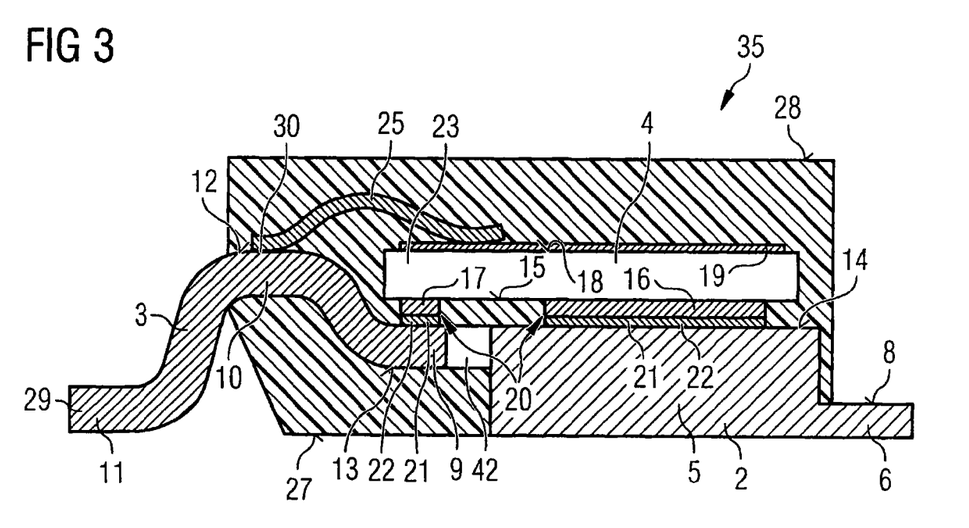
FIG. 3 shows a cross-sectional view of an electronic component according to a third embodiment.

FIG. 3 illustrates an electronic component 35 according to the third embodiment.

Features of the electronic component 35 which are essentially the same as, or perform the same function as, the embodiments shown in FIGS. 1 and 2 are denoted by the same reference number and are not necessarily described again.

The third electronic component 35 has a T0-252 package outline. The leads 3 are, therefore, arranged adjacent one side of the heat sink 2 only. The electronic component 35 also includes a vertical n-channel power MOSFET device 4 with over-temperature and overload protective circuits.

The heat sink 2 of third embodiment comprises a die attach region 5 and a heat dissipating region 6. However, in contrast to the embodiment is shown in FIGS. 1 and 2, the heat dissipating region 6 extends from only one side of the die attach region 5. The heat dissipating region 6 extends from one side of the die attach region 5 and the leads 3 are arranged on the opposing side of the die attach region 5. The lower surface 7 of the heat dissipating region 6 and of the die attach region 5 of the heat sink 2 are again coplanar. The heat dissipating region 6 has a smaller thickness than the die attach region 5.

The MOSFET device 4 comprises a first surface 15 with a source electrode 16 and the gate electrode 17. In this embodiment, the gate electrode 17 is arranged in only one edge region of the MOSFET device 4. The first surface 15 of the MOSFET device 4 is arranged facing the upper surface 14 of the die attach region 5 and is arranged so that the gate contact 17 is positioned adjacent the die attach region 5 on the opposing side of the die attach region 5 to the heat dissipating region 6 of the heat sink 2. The source electrode 16 is mounted on, and electrically connected to, the upper surface 14 of the die attach region 5 of the heat sink 2 by a diffusion solder bond 20.

The leads 3 have essentially the same form as the leads shown in the first and second embodiment in FIGS. 1 and 2. Each of the leads 3, therefore, has an inner portion 9, centre portion 10 and outer portion 11. The inner portion 9 is arranged so that its upper surface 12 is essentially coplanar with the upper surface 14 of the die attach region 5 and its innermost end is arranged adjacent the die attach region 5.

The upper surface 12 of the centre region 10 of each lead 3 lies in essentially the same plane as the drain contact 19 which is positioned on the second opposing surface 18 of the MOSFET device 4. The centre portion 10 of the leads 3 is, therefore, positioned adjacent the MOSFET device 4 whereas the inner portion 9 is positioned under the first surface 15 of the MOSFET device 4. The upper surface 12 of the inner portion 9 of one lead 3 is positioned directly under the gate electrode 17 to enable the gate electrode 17 to be mounted directly on, and electrically connected to, the upper surface 12 of the inner portion 9 of the lead 3 by a diffusion solder bond 20. This lead 3 provides the gate lead 29 of the electronic component 35.

The drain electrode 19 is electrically connected to the drain lead 29, which cannot be seen in the cross-sectional view of FIG. 3, by a bond wire 25 which extends between the drain electrode 19 and the upper surface 12 of the centre portion 10 of the drain lead 29.

The electronic component 35 also includes plastic encapsulation material 26 which encapsulates the MOSFET device 4, bond wires 25, inner portions 9 and centre portions 10 of the leads 3 and the upper surface 14 of the die attach region 5 of the heat sink 2. The outer portions of the lead 3 protruding outside of the plastic encapsulation 26 and provide the outer contact areas of the electronic component 35.

The lower surfaces of the die attach region 5 and heat dissipating region 6 of the heat sink 2 are approximately coplanar with the lower surface 27 of the plastic encapsulation material 26. The heat dissipating region 6 of the heat sink 2, however, projects outside of the plastic encapsulation material 26 so that its upper surface 8 and lower surface 7 remain free from the plastic encapsulation material 26. The heat dissipating region 6, therefore, projects from the plastic encapsulation material 26 on the opposing side of the electronic component 35 to the outer portions 11 of the leads 3.

One or more of the plurality of leads 3 extends from the die attach region 5 of the heat sink 2 to provide a source lead 42. The source lead 42 has generally the same form as the other leads 3 which are not physically attached to the heat sink 2. The inner portion 9 of the heat sink 2 extends from the upper portion of the die attach region 5 do that its upper surface 12 is approximately coplanar with the upper surface 14 of the die attach region. The inner portion 9 of the source lead is, therefore, longer than the inner portion 9 of the drain 30 and gate 29 leads.

In a further embodiment, not illustrated in the figures, the drain electrode 19 is electrically connected to one or more drain leads 30 by a conductive clip. A drain contact element comprising a conductive clip and integral drain lead may also be used. The drain contact element comprises an inner contact portion and an outer contact portion comprising at least one drain lead. The inner contact portion of the drain contact element is mounted on the drain electrode and outer portion which provides the drain lead which extends outside of the plastic encapsulation.

The electronic component 35 is assembled by providing a lead frame strip comprising a plurality of component positions, each component position being essentially the same. Each component position provides the heat sink 2 and plurality of leads 3 arranged adjacent one side of the heat sink with the arrangement and form as shown in the cross-sectional view of FIG. 3.

A MOSFET device 4 is provided with a first surface on which a source electrode 16 and gate electrode 17 are positioned as shown in FIG. 3. A drain electrode 19 is positioned on the opposing second surface to provide a vertical MOSFET device 4. A diffusion solder layer is deposited on the metallization which forms the source electrode 16 and gate electrode 17. Depending on the combination of materials used, a further diffusion barrier layer or refining layer may be first deposited on the metallization before the diffusion solder layer is deposited.

The heat sink 2 and at least the inner portion 9 of the gate lead 28 are heated to a temperature above the melting point of the diffusion solder. The first surface 15 of the MOSFET device 4 is arranged so as to face the upper surface 14 of the die attach region 5 and the upper surface 12 of the inner portion 9 of the gate lead 29.

The MOSFET device 4 is brought into contact with the upper surface 14 of the die attach region 5 and gate lead 29 so that the source electrode 16 is in surface to surface contact with the upper surface 14 of the die attach region 5 and the gate electrode 17 is brought into surface to surface contact with the upper surface 12 of the inner portion 9 of the gate lead 29. As the heat sink 2 and gate lead 29 are at a high temperature than the melting point of the diffusion solder layer, the diffusion solder layer melts and intermetallic phases are formed between the molten diffusion solder and the copper which comprises the heat sink 2 and drain lead 28. These intermetallic phases have a higher melting point than the melting point of the diffusion solder. Therefore, the mechanical and electrical connection between the source electrode 16 and the heat sink 2 and between the gate electrode 17 and the gate lead 29 respectively is formed by the solidification of the interface.

Bond wires 25 are then formed between the drain electrode 19 and the drain lead 30. A molding process is then carried out to encapsulate the bond wires 25, MOSFET device 4, die attach region 5 and inner portions 9 and centre portions 10 of the leads 3. The lower surface 7 of the die attach region 5 and the heat dissipating region 6 of the heat sink 2 remain uncovered by the plastic encapsulation material 26 and provide a ground contact area of the electronic component 35.

Figure 4:
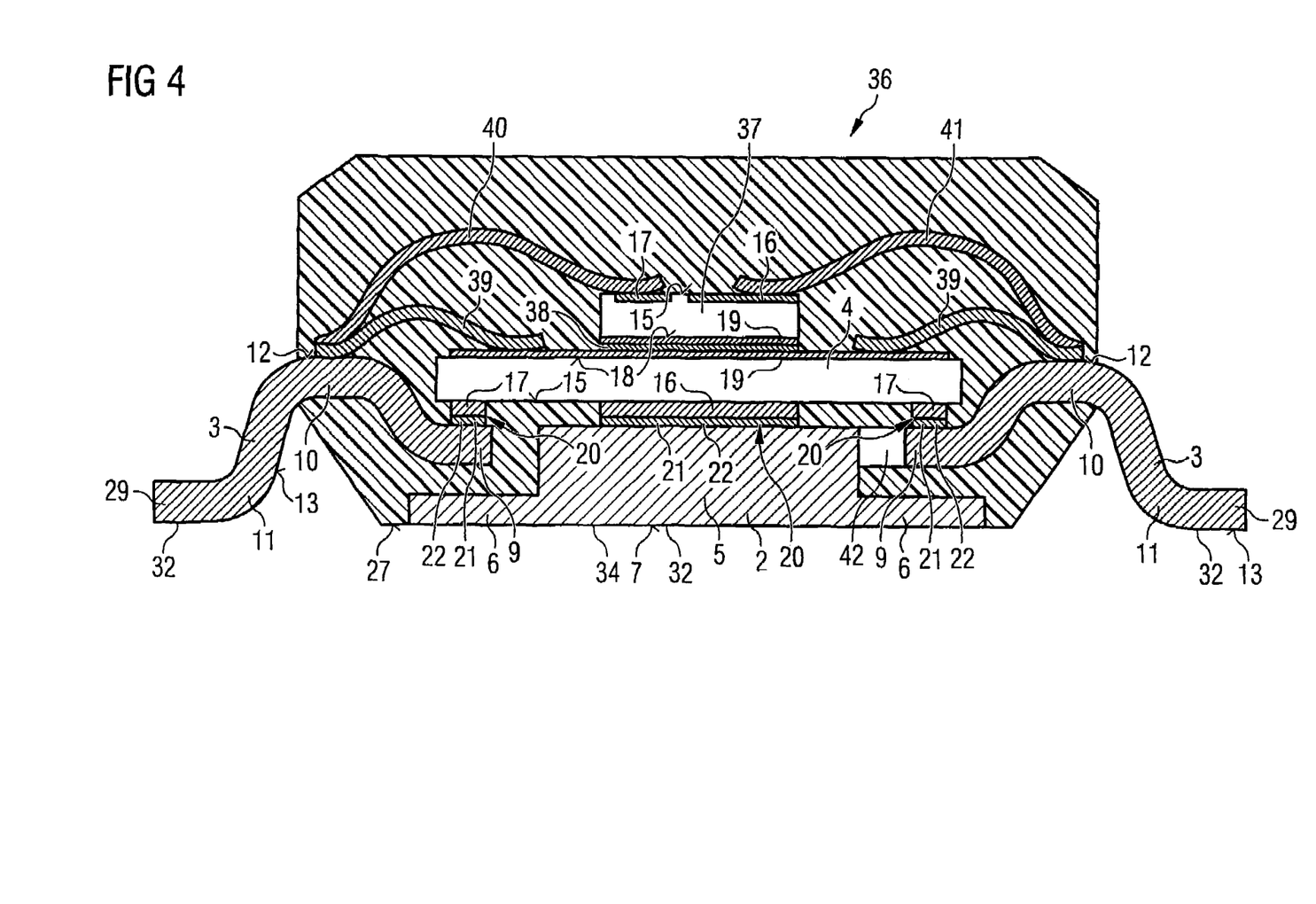
FIG. 4 illustrates a cross-sectional view of an component according to a fourth embodiment.

FIG. 4 illustrates a cross-sectional view of an electronic component 36 according to a fourth embodiment. The fourth embodiment comprises a heat sink 2, plurality of leads 3 and a vertical MOSFET device 4 essentially the same as the first embodiment shown in FIG. 1. The fourth embodiment differs in that the electronic component 36 includes a second MOSFET device 37.

The second MOSFET device 37 comprises a first surface 15 with a source electrode 16 and the least one gate electrode 17. The opposing second surface 18 of the MOSFET device 37 comprises a drain electrode 19. The second MOSFET device 37 is mounted directly on the drain contact 19 of the MOSFET device 4 to form a stack. The second MOSFET device 37 is laterally smaller than the first MOSFET device 4 and is positioned in approximately the lateral centre of the drain electrode 19 of the first MOSFET device 4.

The lower MOSFET device 4, which is mounted directly on the die attach region 5 of the heat sink 2 and gate leads 29, as in the embodiment of FIG. 1, is an n-channel MOSFET device. The second MOSFET device 37 is a p channel MOSFET device. Since the second MOSFET device 37 is a p-channel MOSFET device, the drain electrode 19 normally provides the ground electrode and the source electrode 15 normally provides the high potential electrode. The p-channel MOSFET device 37 is stacked on the n-channel MOSFET device so as to provide a half-bridge circuit in which the lower n-channel MOSFET device 4 is the low side switch and the second MOSFET device 37 is the high side switch.

The drain electrode 19 of the second MOSFET 37 is mounted on, and electrically connected to, the drain electrode 19 of the first MOSFET device 4 by a diffusion solder bond 38. The electrical connection between the drain electrodes 19 of the upper MOSFET 37 and lower MOSFET 4 provides the node of the half-bridge arrangement. A bond wire 39 extends between an uncovered region of the drain electrode 19 of the first MOSFET 4 to a lead 3 of the electronic component 36 which provides an output lead.

The source electrode 16 and gate electrode 17 of the second MOSFET 37, therefore, face upwards away from the lower MOSFET device 4, heat sink 2 and leads 3. The gate electrode 17 of the second MOSFET 37 is electrically connected to leads 3 by bond wires 40. The bond wires 40 comprise gold and have a diameter of approximately 25 μm. The source electrode 16 of the second MOSFET 37 is electrically connected to least one lead 3 by a bond wire 41 which comprises aluminum and has a diameter of approximately 250 μm.

The electronic component 36 may also comprise one or more control chips for controlling the gate electrodes 17 of the first MOSFET device 4 and second MOSFET device 37.

The fourth electronic component 36 may be assembled similarly to the first embodiment. After the lower MOSFET device 4 is mounted on, and electrically connected to, the die attach region 5 of the heat sink 2 and the gate leads 29, the drain electrode 19 of the second MOSFET device 37 is mounted on the drain electrode 19 of the first MOSFET device 4. This may be carried out by a diffusion bonding process by providing a diffusion solder layer on the drain electrode 19 of the second MOSFET device 37.

After the drain electrode 19 of the second MOSFET device 37 has been mounted on, and electrically connected to, the drain electrode 19 of first MOSFET device 4, bond wires 39, 40, 41 are formed between the gate electrode 17 of the MOSFET device 37, source electrode 15 of the second MOSFET device 37 and leads 3 to provide the desired circuit. The node created by the electrical connection between the drain electrodes 19 of the first MOSFET 4 and second MOSFET 37 is electrically connected to an output lead by further bond wire 39. If one or more control semiconductor chips are included in the electronic component 36, further bond wires may be provided between the control semiconductor chips and the gate electrodes 19 the MOSFET devices 4, 37 and the node.

The two MOSFET devices 4, 37, control chips if present, bond wires 39, 40, 41, inner portions 9 and centre portions 10 of the leads 3 are encapsulated in plastic encapsulation material 26 as previously described. The lower surface 7 of the heat sink 2 remains exposed from the plastic encapsulation 26 and provides the ground contact 34 of the half-bridge arrangement.

REFERENCE NUMBERS 1 first electronic component
2 heat sink
3 leads
4 MOSFET device
5 die attach region
6 heat dissipating region
7 lower surface of heat sink
8 upper surface of heat dissipating region of heat sink
9 inner portion of lead
10 centre portion of lead
11 outer portion of lead
12 upper surface of lead
13 lower surface of lead
14 upper surface of die attach region
15 first surface of MOSFET
16 source electrode
17 gate electrode
18 second surface of MOSFET
19 drain electrode
20 diffusion solder bond
21 diffusion solder layer
22 intermetallic phases
23 edge region of MOSFET
24 contact area
25 bond wire
26 plastic encapsulation material
27 lower surface of plastic encapsulation
28 outer surface of plastic encapsulation material
29 gate lead
30 drain lead
31 conductive clip
32 outer contact area of electronic component
33 second electronic component
34 outer contact area
35 third electronic component
36 fourth electronic component
37 second MOSFET device
38 diffusion solder bond
39 bond wire
40 bond wire
41 bond wire
42 source lead

What is claimed is:

1. An electronic component, comprising:
   at least one semiconductor power switch comprising a first surface and a second surface, wherein at least one anode and at least one control electrode are positioned on the first surface and at least one cathode is positioned on the second surface;
   a heat sink comprising a die attach region with an upper surface and a lower surface;
   a plurality of leads with an upper surface and a lower surface, each lead comprising an inner portion, a centre portion and an outer portion;
   wherein at least one lead is a control lead and wherein the inner portion of the control lead is spaced from the die attach region of the heat sink by a first distance and wherein the upper surface of the inner portion of the control lead lies in a plane generally coplanar with the upper surface of the die attach region of the heat sink, and wherein the upper surface of the central portion of the control lead lies in a plane above the upper surface of the inner portion of the control lead;
   wherein the anode of the semiconductor power switch is mounted on the die attach region of the heat sink and at least one control electrode is mounted on the upper surface of the inner portion of the control lead.

2. An electronic component according to claim 1, wherein the outer portion of at least the control lead is bent to provide the lead with a gull-wing-shape.

3. An electronic component according to claim 1, wherein the outer portion of each of the plurality of leads is bent to provide each lead with a gull-wing-shape.

4. An electronic component according to claim 1, wherein the upper surface of the central portion of the plurality of leads is generally coplanar with the second side of the semiconductor power switch.

5. An electronic component according to claim 1, wherein the plurality of leads are positioned adjacent one side of the die attach region of the heat sink and extend in a direction generally perpendicular to the side of the die attach region of the heat sink.

6. An electronic component according to claim 1, wherein the plurality of leads are positioned adjacent two opposing sides of the die attach region of the heat sink and extend in a direction generally perpendicular to the side of the die attach region of the heat sink.

7. An electronic component according to claim 1, wherein the semiconductor power switch comprises at least one control electrode positioned in edge regions of two opposing sides of the first surface, wherein at least one control lead is positioned adjacent two opposing sides of the die attach region of the heat sink and wherein one control electrode is mounted on, and electrically connected to, each control lead.

8. An electronic component according to claim 1, wherein at least one lead is a cathode lead, and the cathode of the semiconductor power switch is electrically connected to the cathode lead.

9. An electronic component according to claim 8, wherein the cathode of the semiconductor power switch is electrically connected to the cathode lead by a contact element, the contact element being one of at least one bond wire and a conductive clip.

10. An electronic component according to claim 1, wherein at least one lead is a cathode lead, the cathode lead having an inner portion spaced from the die attach region of the heat sink by the first distance and wherein the upper surface of the inner portion of the cathode lead lies in a plane generally coplanar with the upper surface of the die attach region of the heat sink, and wherein the upper surface of the central portion of the cathode lead lies in a plane above the upper surface of the inner portion of the cathode lead.

11. An electronic component according to claim 10, wherein a contact area is positioned on the upper surface of the central portion of the cathode lead and the cathode of the semiconductor power switch is electrically connected to the contact area by a contact element.

12. An electronic component according to claim 11, wherein the contact element is one of at least one bond wire and a conductive clip.

13. An electronic component according to claim 1, wherein the electronic component further comprises a cathode contact element which comprises an inner contact portion which is positioned on the cathode and at least one outer contact portion comprising at least one cathode lead.

14. An electronic component according to claim 13, wherein the cathode contact element comprises two outer contact portions, the two outer contact portions extending on opposing sides of the inner contact portion and each outer contact portion comprising at least one cathode lead.

15. An electronic component according to claim 1, wherein the heat sink comprises a heat dissipating region protruding from at least one side of the die attach region, wherein the die attach region of the heat sink has a first thickness and the heat dissipation region has a second thickness which is smaller than the first thickness and wherein the heat dissipating region has a lower surface which is generally coplanar with the lower surface of the die attach region of the heat sink.

16. An electronic component according to claim 15, wherein at least one control lead is positioned over the heat dissipating region, the lower surface of the inner portion of the control lead being spaced at a distance from the upper surface of the heat dissipating region.

17. An electronic component according to claim 1, further comprising at least one further semiconductor component attached to the semiconductor power switch.

18. An electronic component according to claim 17, wherein the further semiconductor component is mounted on the cathode of the semiconductor power switch.

19. An electronic component according to claim 1, wherein the semiconductor power switch is a MOSFET.

20. An electronic component according to claim 1, wherein the anode is mounted on, and electrically connected to, the die attach region of the heat sink by a diffusion solder bond and the control electrode is mounted on, and electrically connected to, the control lead by a diffusion solder bond.

21. An electronic component according to claim 1, further comprising a plastic housing composition, the plastic housing composition encapsulating at least the inner portions and central portions of the leads and the semiconductor power switch, wherein the outer portions of the leads extend outside the plastic housing composition.

22. An electronic component according to claim 21, wherein the heat sink comprises a heat dissipating region protruding from at least one side of the die attach region, wherein the die attach region of the heat sink has a first thickness and the heat dissipation region has a second thickness which is smaller than the first thickness and wherein the heat dissipating region has a lower surface which is generally coplanar with the lower surface of the die attach region of the heat sink, the lower surface of the heat sink being generally coplanar with a lower surface of the plastic housing composition.

* * * * *